United States Patent
Murakami

(10) Patent No.: US 10,269,409 B2
(45) Date of Patent: Apr. 23, 2019

(54) NON-VOLATILE SEMICONDUCTOR MEMORY DEVICE AND DRIVING METHOD FOR BLOCK SELECTION BY BOOSTING THEREOF

(71) Applicant: Winbond Electronics Corp., Taichung (TW)

(72) Inventor: Hiroki Murakami, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/613,285

(22) Filed: Jun. 5, 2017

(65) Prior Publication Data

US 2017/0365325 A1 Dec. 21, 2017

(30) Foreign Application Priority Data

Jun. 20, 2016 (JP) ................................. 2016-121359

(51) Int. Cl.
*G11C 11/408* (2006.01)
*G11C 8/08* (2006.01)
(Continued)

(52) U.S. Cl.
CPC ............ *G11C 11/4085* (2013.01); *G11C 8/08* (2013.01); *G11C 8/14* (2013.01); *G11C 11/4074* (2013.01);
(Continued)

(58) Field of Classification Search
CPC ............ G11C 11/4085; G11C 11/4074; G11C 11/4082; G11C 11/4099; G11C 11/5621; G11C 8/08; G11C 8/14
See application file for complete search history.

(56) References Cited

U.S. PATENT DOCUMENTS

| 7,161,837 | B2 * | 1/2007 | Park | ......................... | G11C 8/08 |
| | | | | | 365/185.11 |
| 2003/0043686 | A1 * | 3/2003 | Lee | ........................ | G11C 16/08 |
| | | | | | 365/244 |

(Continued)

FOREIGN PATENT DOCUMENTS

| CN | 101138048 | 3/2008 |
| JP | 2002197882 | 7/2002 |

(Continued)

OTHER PUBLICATIONS

"Office Action of Taiwan Counterpart Application," dated Feb. 12, 2018, p. 1-p. 9.

(Continued)

*Primary Examiner* — Sung Cho
(74) *Attorney, Agent, or Firm* — JCIPRNET

(57) ABSTRACT

A non-volatile semiconductor memory device and a driving method for word lines thereof are provided. A flash memory of the invention includes a memory cell array including blocks and a block selection element selecting the block of the memory cell array based on row address information and including a block selection transistor, a level shifter, a boost circuit and a voltage supplying element. The block selection transistor is connected to each word line of the block. The level shifter supplies a voltage to a node connected to a gate of the block selection transistor. The boost circuit boosts a potential of the node. The voltage supplying element supplies an operation voltage to one of the terminals of the block selection transistor. The node, after performing first boosting by the operating voltage supplied by the supplying element, performs second boosting by the second circuit.

13 Claims, 5 Drawing Sheets

(51) Int. Cl.
*G11C 8/14* (2006.01)
*G11C 11/4074* (2006.01)
*G11C 11/4099* (2006.01)
*G11C 11/56* (2006.01)
*G11C 16/04* (2006.01)
*G11C 16/08* (2006.01)
*G11C 16/30* (2006.01)

(52) U.S. Cl.
CPC ...... *G11C 11/4082* (2013.01); *G11C 11/4099* (2013.01); *G11C 11/5621* (2013.01); *G11C 16/0483* (2013.01); *G11C 16/08* (2013.01); *G11C 16/30* (2013.01)

(56) References Cited

U.S. PATENT DOCUMENTS

| | | | | |
|---|---|---|---|---|
| 2003/0133326 | A1* | 7/2003 | Hosono | G11C 16/0483 365/185.18 |
| 2004/0156237 | A1* | 8/2004 | Jeong | G11C 8/12 365/185.18 |
| 2005/0185471 | A1 | 8/2005 | Lee | |
| 2006/0083062 | A1* | 4/2006 | Park | G11C 16/30 365/185.11 |
| 2007/0014184 | A1* | 1/2007 | Lee | G11C 8/08 365/230.06 |
| 2008/0018380 | A1* | 1/2008 | Campardo | H02M 3/07 327/536 |
| 2008/0123410 | A1* | 5/2008 | Shirakawa | G11C 8/08 365/185.03 |
| 2008/0310229 | A1* | 12/2008 | Hamada | G11C 8/08 365/185.11 |
| 2009/0196103 | A1* | 8/2009 | Kim | G11C 8/08 365/185.12 |
| 2011/0019477 | A1* | 1/2011 | Hashimoto | G11C 16/06 365/185.11 |
| 2013/0077412 | A1* | 3/2013 | Sivero | G11C 8/08 365/185.23 |
| 2013/0077413 | A1* | 3/2013 | Yano | G11C 16/08 365/185.23 |
| 2013/0088284 | A1* | 4/2013 | Jeong | G11C 8/08 327/537 |
| 2014/0104948 | A1* | 4/2014 | Rhie | G11C 8/08 365/185.11 |
| 2014/0119112 | A1* | 5/2014 | Sivero | G11C 8/08 365/185.2 |
| 2014/0119122 | A1* | 5/2014 | Park | G11C 16/0483 365/185.17 |
| 2014/0204676 | A1* | 7/2014 | Kim | G11C 16/30 365/185.18 |
| 2014/0347949 | A1* | 11/2014 | Koo | G11C 8/12 365/230.03 |
| 2015/0255162 | A1* | 9/2015 | Shibazaki | G11C 29/025 365/185.05 |
| 2017/0084335 | A1* | 3/2017 | Hahn | G11C 16/08 |

FOREIGN PATENT DOCUMENTS

| | | |
|---|---|---|
| JP | 2008186498 | 8/2008 |
| JP | 2013073657 | 4/2013 |
| TW | 512352 | 12/2002 |

OTHER PUBLICATIONS

"Office Action of Korea Counterpart Application", dated Oct. 22, 2018, with English translation thereof, p. 1-p. 9.

* cited by examiner

| BLK selection element 200_1023 | Block_1023 |
| BLK selection element 200_1022 | Block_1022 |
| ⋮ | ⋮ |
| BLK selection element 200_1 | Block_1 |
| BLK selection element 200_0 | Block_0 |

| Level shifter 210_127 | Block _7/6/5/4/3/2/1/0 |
|---|---|
| Level shifter 210_126 | Block _7/6/5/4/3/2/1/0 |
| ⋮ | ⋮ |
| Level shifter 210_1 | Block _7/6/5/4/3/2/1/0 |
| Level shifter 210_0 | Block _7/6/5/4/3/2/1/0 |

| XB7 | XB6 | XB5 | XB4 | XB3 | XB2 | XB1 | XB0 |
|---|---|---|---|---|---|---|---|
| XT7 | XT6 | XT5 | XT4 | XT3 | XT2 | XT1 | XT0 |

FIG.7

NON-VOLATILE SEMICONDUCTOR MEMORY DEVICE AND DRIVING METHOD FOR BLOCK SELECTION BY BOOSTING THEREOF

CROSS-REFERENCE TO RELATED APPLICATION

This application claims the priority benefit of Japan application serial no. 2016-121359, filed on Jun. 20, 2016. The entirety of the above-mentioned patent application is hereby incorporated by reference herein and made a part of this specification.

BACKGROUND

Field of the Invention

The invention is directed to a non-volatile semiconductor memory device (e.g., a flash memory) and a driving method for a word line thereof.

Description of Related Art

An NAND or an NOR flash memory requires a high voltage for a data reading, programming or erasing operation. Generally, in the flash memory, a low power supply voltage is supplied from the external, the supplied voltage is boosted by a charge pump, and a program voltage or an erase voltage is generated by the boosted voltage. If a word line decoder is provided with the charge pump, the size of the word line decoder is increased due to the area occupied by a capacitor. Thus, Japanese Patent Publication No. 2002-197882 discloses a word line decoder of which a layout area is reduced by omitting a charge pump. The word line decoder is self-boosted by a word line enablement signal used for enabling the word line, thereby suppressing the reduction of a word line driving voltage.

The reading or programming operation in the flash memory is usually performed by using a page as a unit. A word line selection circuit selects a block from a memory cell array by decoding a row address and selects a word line in the selected block. FIG. 1 illustrates a block selection operation of the word line selection circuit. A voltage Vpp boosted by a charge pump circuit 10 is supplied to a level shifter 20. The level shifter 20, in response to a decoding result of the row address (which is a block selection signal BLKSEL), outputs an output signal BDRV. The output signal BDRV of the level shifter 20 is commonly connected to a gate of a block selection transistor 30. The block selection transistor 30, in response to the output signal BDRV, supplies a voltage supplied by a voltage supplying element 40 to each word line (WL0 to WL31) and each selection gate line (SGD and SGS) of the selected block 50.

For example, during a programming operation, the voltage supplying element 40 supplies an intermediate voltage (e.g., 10 V) to each word line of the selected block, then, a program voltage (e.g., 25 V) to a selected word line, an intermediate voltage (e.g., 10 V) to a non-selected word line, a driving voltage (e.g., a Vcc voltage or 5 V, and so on) to the selection gate line SGD, and 0 V to the selection gate line SGS. Additionally, a potential corresponding to data "0" or "1" is supplied to a bit line GBL by a page buffer/read circuit. On the other hand, the level shifter 20, in the consideration of a voltage drop of a threshold of the block selection transistor 30 and a back gate bias effect from a source when the block selection transistor 30 is turned on, supplies an output signal BDRV with a voltage (e.g., 31 V) which is higher than the program voltage, so as to prevent the program voltage from decreasing. Thus, the charge pump circuit 10 has to generate a boost voltage Vpp of at least 31 V.

In order to generate a high voltage (e.g., 31 V) by the charge pump circuit 10, the number of stages of the charge pumps has to be increased. In particular, if the external power supplied to the memory chip is a low voltage, the number of stages has to be correspondingly increased. However, in case the number of stages of the charge pump circuit 10 is increased, boosting efficiency will be decreased. Therefore, issues of increased power consumption and an increased occupied area of the charge pump circuit 10 arise.

SUMMARY

A purpose of the invention is to solve the issues of the related art and provides a non-volatile semiconductor memory device capable of achieving space saving and power saving.

A non-volatile semiconductor memory device of the invention includes a memory cell array including and a block selection element. The memory cell array includes a plurality of blocks. The block selection element selects one of the blocks of the memory cell array based on row address information. The block selection element includes a plurality of selection transistors connected to each word line of the block, a first circuit charging a connection node connected to each gate of the selection transistors, a second circuit connected to the first circuit and boosting a voltage of the connection node and a supplying element supplying an operating voltage to one terminal of the selection transistors. The connection node, after performing first boosting by the operating voltage supplied by the supplying element, performs second boosting by the second circuit.

Preferably, the second circuit includes a capacitor connected to the connection node and supplies a voltage output from the first circuit to the capacitor. Preferably, the second circuit includes a first transistor connected between the second circuit and the first circuit, and when the first transistor is set to a turned-on state, the voltage output from the first circuit is supplied to an electrode of the capacitor through the first transistor. Preferably, the second circuit includes a second transistor connected between the second circuit and the first circuit, and when the second transistor is set to a turned-on state, the voltage output from the first circuit is charged to the connection node through the second transistor. Preferably, the first circuit includes a level shifter outputting a first voltage based on a high voltage supplied from a charge pump circuit. Preferably, the memory cell array includes the blocks in m rows×n columns (m and n are integers of 2 or more), and the first circuit is shared by the blocks of one row. Preferably, each of the blocks comprises the second circuit. Preferably, the operating voltage is an intermediate voltage employed for turning on an NAND string when the first boosting is performed. Preferably, the supplying element supplies a program voltage to a selected word line after the intermediate voltage is supplied, and the program voltage is supplied to the selected word line through the selection transistor performing the second boosting.

A driving method for a word line in a non-volatile semiconductor memory device of the invention include the following steps: charging a first voltage to each gate of a plurality of selection transistors configured to select a block of a memory cell array in response to row address information; supplying an operating voltage required for each word line to one terminal of a plurality of block selection transistors, so as to boost the first voltage of each gate to a second voltage; and supplying a voltage to a capacitor connected to each gate, so as to boost the second voltage to a third voltage through the capacitor.

Preferably, the voltage supplied to the capacitor is the first voltage. Preferably, the operating voltage is an intermediate voltage employed for turning on an NAND string. Preferably, the first voltage is employed for charging by a level shifter supplied with a high voltage from a charge pump circuit, and the boosting from the second voltage to the third voltage is performed by a boost circuit using the voltage output from the level shifter.

According to the invention, the gate voltage of the selection transistors connected to the word line is boosted in two stages. Thereby, the voltage employed for charging each gate of the selection transistors can be reduced. As a result, the high voltage generated by the boost circuit, e.g., the charge pump circuit, is smaller than the related art, so as to achieve reduction in the occupied area and the power consumption of the boost circuit.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 7 illustrates a layout of the relationship between blocks of the memory cell array and a level shifter according to a second embodiment of the invention.

DESCRIPTION OF EMBODIMENTS

Hereinafter, embodiments of the invention will be described with reference to the accompanying drawings. In a preferable aspect, the invention is embodied in a flash memory.

[Embodiments]

Figure 2:
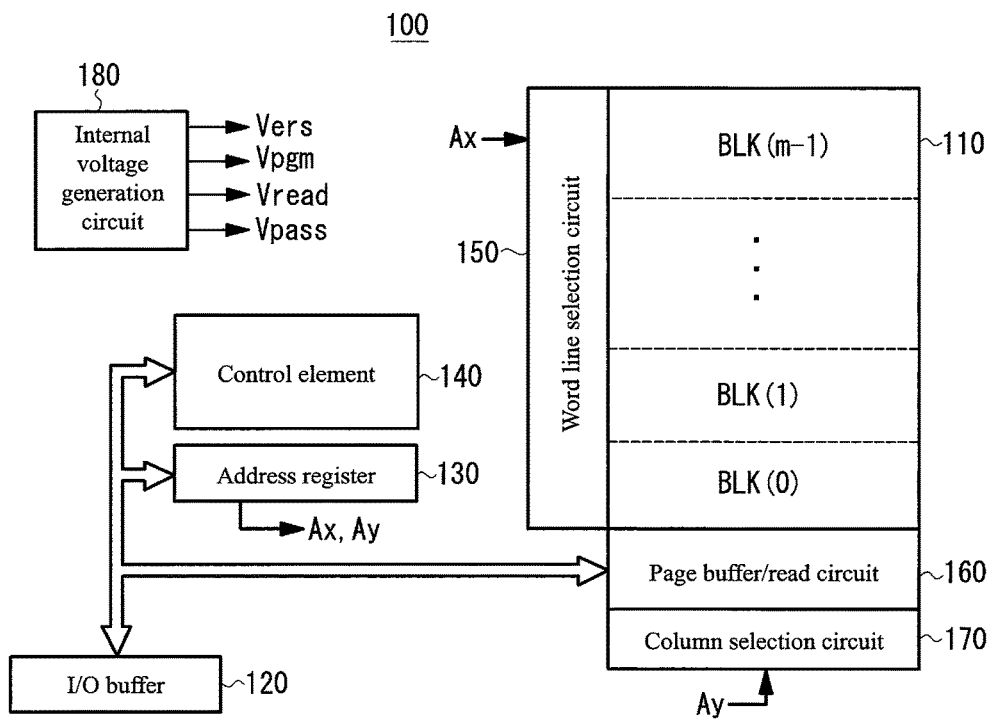
FIG. 2 illustrates a structure of a flash memory according to a first embodiment of the invention.

FIG. 2 illustrates a structure of a flash memory according to a first embodiment of the invention. As illustrated in FIG. 2, a flash memory 100 includes a memory cell array 110 having a plurality of memory cells arranged in an array, an input/output (I/O) buffer 120 connected to an external I/O terminal I/O to hold I/O data, an address register 130 receiving address data from the I/O buffer 120, a control element 140 receiving command data from the I/O buffer 120 or a control signal from the external to control each element, a word line selection circuit 150 receiving row address information Ax from the address register 130 and selecting a block and a word line based on a decoding result of the row address information Ax, a page buffer/read circuit 160 holding data read from a page selected by the word line selection circuit 150 or data to be written into the selected page, a column selection circuit 170 receiving column address information Ay from the address register 130 and selecting data in the page buffer/read circuit 160 based on a decoding result of the column address information Ay, and an internal voltage generation circuit 180 generating various voltages (e.g., a write voltage Vpgm, a pass voltage Vpass, a read voltage Vread, an erase voltage Vers and so on) required for reading, programming and erasing data.

Figure 3:
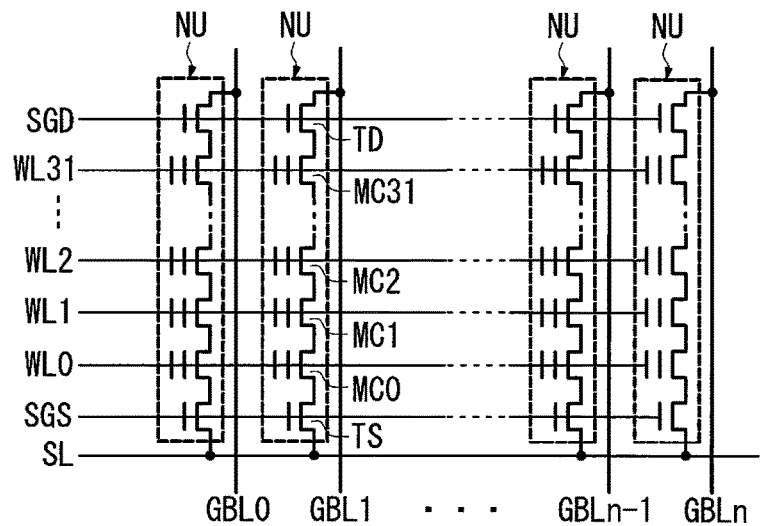
FIG. 3 is a circuit diagram of a structure of NAND strings of the memory cell array according to the first embodiment of the invention.

The memory cell array 110 has m memory blocks BLK (0), BLK (1), . . . and BLK (m−1)) arranged along a column direction. The page buffer/read circuit 160 is disposed adjacently to the block BLK (0). Referring to FIG. 3, a plurality of NAND string units NU connecting a plurality of memory cells in series are formed in a memory block, and (n+1) NAND string units NU arranged along the column direction are formed in a memory block. Each of the NAND string units NU includes a plurality of memory cells MCi (i=0, 1, . . . , 31) connected in series, a bit line side selection transistor TD connected with a drain side of the memory cell MC31 at one end, and a source line side selection transistor TS connected with a source side of the memory cell MC0 at another end. A drain of the bit line side selection transistor TD is connected to a corresponding bit line GBL, a source of the selection transistor TS is connected to a common source line SL. FIG. 3 illustrates a typical cell unit, but the cell unit may also be an NAND string including one or more dummy cells and may be a three-dimensional structure.

The memory cells typically has a metal oxide semiconductor (MOS) structure which includes a source/drain serving as a N-type diffusion region and formed in a P-well, a tunnel oxide film formed on a channel between the source and the drain, a floating gate (i.e., an electric charge accumulating layer) formed on the tunnel oxide film and a control gate formed on the floating gate through a dielectric film. The memory cell may be a single level cell (SLC) type that can store data of 1 bit (binary data), or a multi level cell (MLC) type that can store data of multiple bits.

Control gates of the memory cells MCi are connected to word lines WLi, and gates of the selection transistors TD and TS are connected to the selection gate lines SGD and SGS in parallel to the word lines WL. When selecting the block based on the row address information Ax, in correspondence to the reading operation, the programming operation, the erasing operation and so on, the word line selection circuit 150 selectively drives the selection transistors TD and TS via the selection gate lines SGS and SGD of the block and selectively drives a selected word line and a non-selected word line via the word lines WL0 to WL31.

In the flash memory 100, during the reading operation, a specific positive voltage is applied to a bit line, a specific voltage (e.g., 0 V) is applied to the selected word line, the pass voltage Vpass (e.g., 4.5 V) is applied to the non-selected word line, and a positive voltage (e.g., 4.5 V) is applied to the selection gate lines SGD and SGS, such that the bit line side selection transistor TD and the source line side selection transistor TS are turned on, and a voltage of 0 V is applied to the common source line. During the programming (writing) operation, a high-level program voltage Vpgm (15 V to 25 V) is applied to the selected word line, an intermediate-level voltage (e.g., 10 V) is applied to the non-selected word line, such that the bit line side selection transistor TD is turned on, the source line side selection transistor TS is turned off, and a potential corresponding to data "0" or "1" is supplied to the bit line GBL. During the erasing operation, a voltage of 0 V is applied to the selected word line in the block, a high voltage (e.g., 20 V) is applied to the P-well, and electrons of the floating gate are drawn out to the substrate, thereby erasing the data by using a block as a unit.

Figure 4:
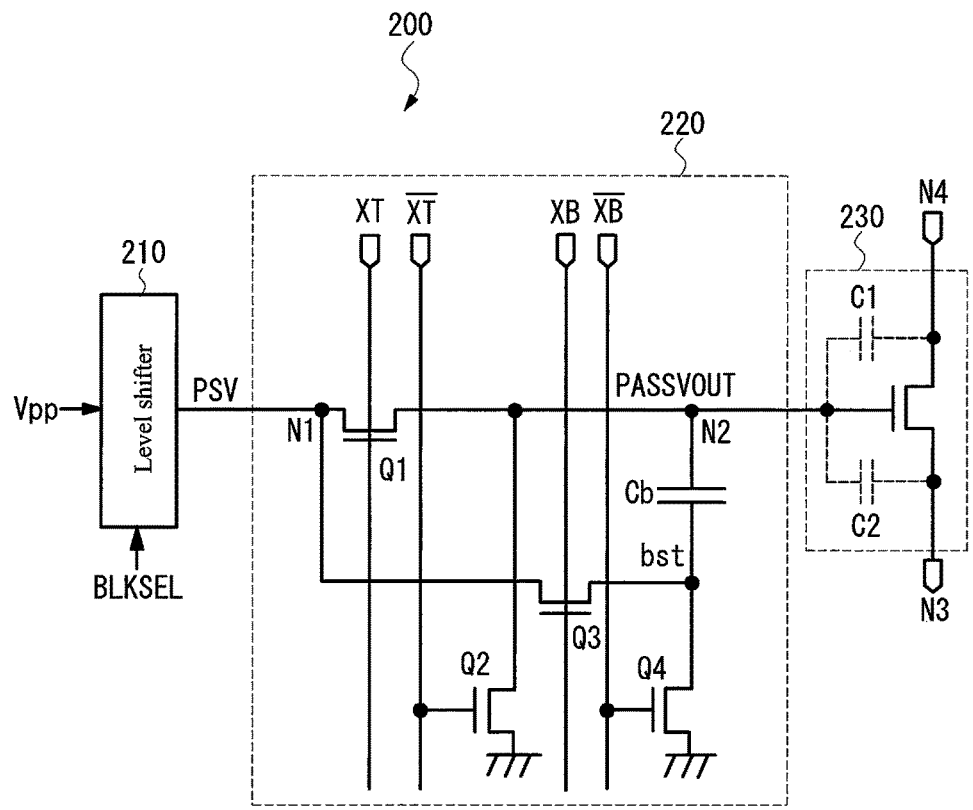
FIG. 4 illustrates a structure of a word line selection circuit according to the first embodiment of the invention.

Afterwards, please refer to FIG. 4 for detailed description related to the word line selection circuit 150 of the present embodiment. The word line selection circuit 150 includes a block selection element 200 used for selecting the blocks of the memory cell array 110. The block selection element 200 selects a block based on a decoding result of the row address information Ax and drive a word line of the selected block. In the first embodiment, one block selection element 200 is prepared for one block. For example, when the memory cell array 110 has 1028 blocks along a column direction, 1028 block selection elements 200 are prepared.

Figure 1:
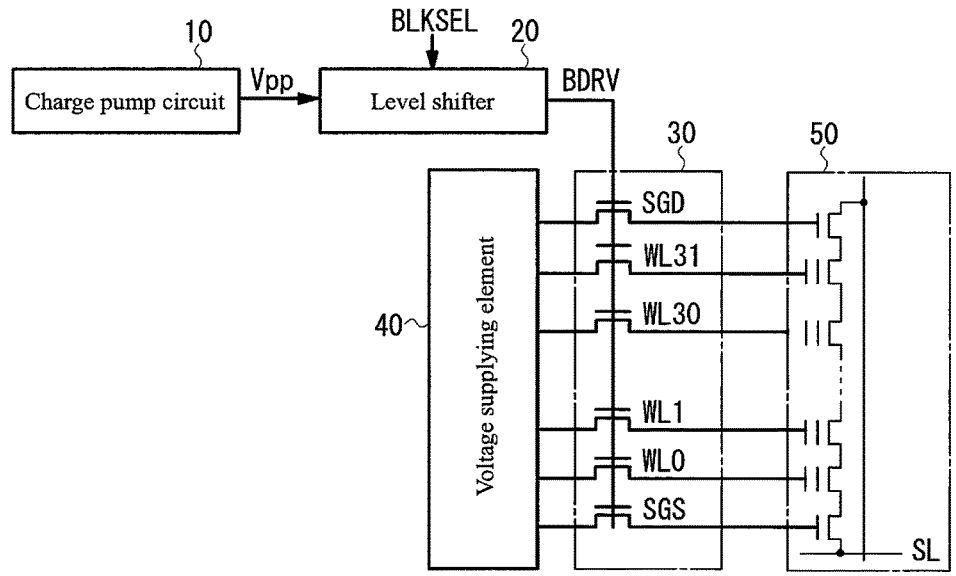
FIG. 1 illustrates an operation of a conventional word line selection circuit.

A block selection element 200 includes a level shifter 210. The level shifter 210 inputs a high voltage Vpp boosted by a charge pump circuit and outputs a voltage PSV to a node N1 according to the block selection signal BLKSEL. Namely, the level shifter 210, in response to the row address decoding result, i.e., the block selection signal BLKSEL, outputs the voltage PSV when the block selection signal BLKSEL is at an H level and does not output the voltage PSV when the block selection signal BLKSEL is at an L level. Additionally, the high voltage Vpp is supplied to the level shifter 210 from a charge pump circuit which is not shown. However, preferably, the charge pump circuit of the present embodiment supplies the high voltage Vpp of, for example, 25 V to the level shifter 210. The high voltage Vpp herein is smaller than the high voltage Vpp (e.g., 31 V) supplied by the charge pump circuit 10 of the related art, as illustrated in FIG. 1.

The block selection element 200 further includes a boost circuit 220. The boost circuit 220 is configured to boost a voltage PASSVOLT of a node N2 connected to a gate of a block selection transistor 230. The boost circuit 220 includes four NMOS transistors Q1, Q2, Q3 and Q4 which can bear high voltage and a capacitor Cb used for boosting. The transistor Q1 is connected between the node N1 connected to the level shifter 210 and the node N2 and supplies a local clamp signal XT to gates thereof. The transistor Q2 is connected between the node N2 and the ground GND and supplies an inverted signal (/XT) of the local clamp signal XT to gates thereof. When the transistor Q1 is turned on, and the transistor Q2 is turned off, the high voltage PSV of the node N1 is charged to the node N2 via the transistor Q1. On the other hand, when the transistor Q1 is turned off, and the transistor Q2 is turned on, the charge of the node N2 is discharged to the ground GND via the transistor Q2.

The transistor Q3 is connected between the node Ni and a node bst and supplies a local boost signal XB to gates thereof. The transistor Q4 is connected between the node bst and the ground GND and supplies an inverted signal (/XB) of the local boost signal XB to gates thereof When the transistor Q3 is turned on, and the transistor Q4 is turned off, the high voltage PSV of the node N1 is applied to the node bst. On the other hand, when the transistor Q3 is turned off, and the transistor Q4 is turned on, the charge of the node bst is discharged to the ground GND via the transistor Q4. The capacitor Cb is connected between the node bst and the node N2, so as to couple capacitances of the node bst and the node N2. The size of the capacitor Cb may be adaptively selected according to a load of the block selection transistor driven by the node N2, the required voltage and so on.

The boost circuit 220 is operated preferably in a condition that a high voltage is required for driving the selected word line. For instance, during the programming operation, the local clamp signals XT and /XT and the local boost signals XB and /XB are selectively driven, and the voltage PASSVOLT of the node N2 is boosted by the capacitor Cb, thereby preventing a drop from occurring to the operating voltage supplied to the selected word line from the block selection transistor 230. Preferably, when the local clamp signals XT and /XT and the local boost signals XB and /XB are drive to the H level, their voltage levels may be at the same level of the voltage PSV.

The node N2 of the boost circuit 220 is connected to the gate of the block selection transistor 230. Although FIG. 4 only illustrates one block selection transistor 230, actually, as illustrated in FIG. 1, one of the terminals (i.e., a source electrode) of the block selection transistor is connected to the word lines WL0 to WL31 of the NAND strings and the selection gate lines SGD and SGS in the block via the node N3. In addition, another terminal (i.e., a drain electrode) of each block selection transistor 230 is connected to the voltage supplying element (referring to FIG. 1) supplying the operating voltages for programming, reading, erasing and so on via a node N4. These block selection transistors 230 include NMOS transistors which can bear high voltage.

Figures 5, 6:
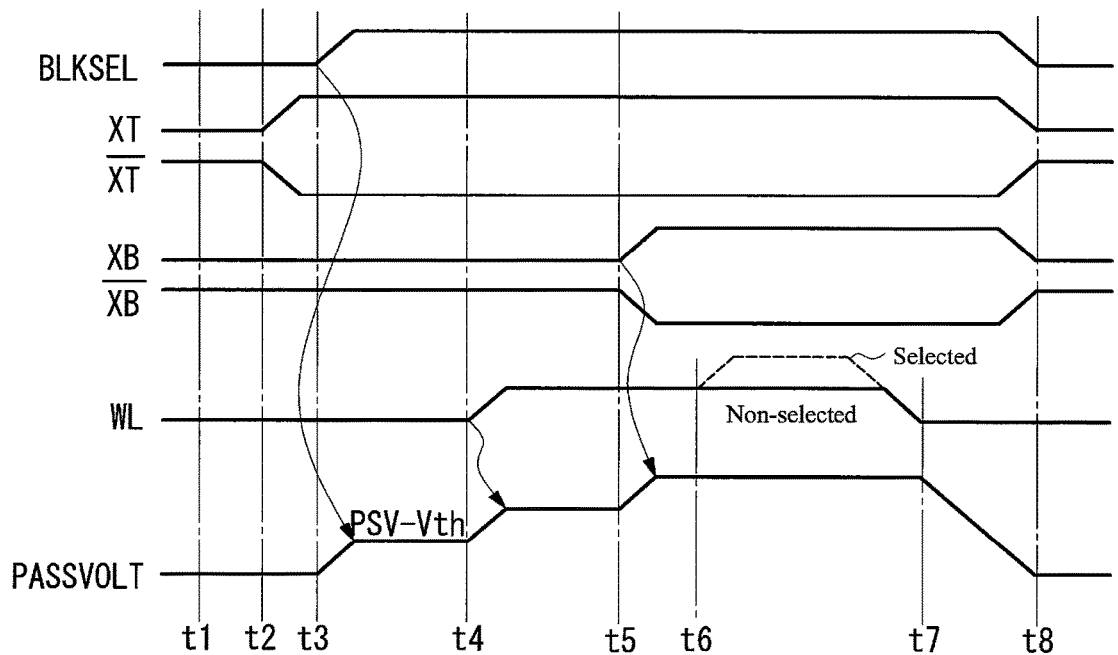
FIG. 5 is a waveform diagram illustrating the operation of the word line selection circuit according to the first embodiment of the invention.
FIG. 6 illustrates a layout of the relationship between blocks of the memory cell array and the block selection element according to the first embodiment of the invention.

Afterwards, please refer to FIG. 5 for the description of the operation of the block selection element 200 of the present embodiment. At a time t1, the local clamp signal XT is at the L level, /XT is at the H level, the transistor Q1 is turned off, the transistor Q2 is turned on, and the node N2 is electrically connected to the ground GND via the transistor Q2. In addition, the local boost signal XB is at the L level, /XB is at the H level, the transistor Q3 is turned off, the transistor Q4 is turned on, the node bst is electrically connected to the GND level.

At a time t2, the block selection element 200 drives the local clamp signal XT to the H level and drives /XT to the L level. In this way, the transistor Q1 is turned on, the transistor Q2 is turned off, and the node N2 is disconnected from the ground GND.

At a time t3, the block selection signal BLKSEL is transited to the H level. In response thereto, the level shifter 210 outputs a voltage PSV (e.g., 25 V) to the node N1 based on the high voltage Vpp from the charge pump circuit. As the transistor Q1 is in the turned-on state, the node N2 is charged by the voltage PSV, and the voltage PASSVOLT is at a PSV-Vth level (Vth is a threshold of the transistor Q1). In this way, the voltage PASSVOLT is supplied to each gate of the block selection transistor 230, and the block selection transistor 230 is turned on for block selection. Additionally, the operation at the time t3 may be performed before the operation at the time t2.

At a time t4, the voltage supplying element supplies an intermediate voltage (e.g., 10 V) to the block selection transistors 230 via the node N4 for all the word lines of the selected block. In this circumstance, in all the block selection transistors 230 supplied with the intermediate voltage, the voltage PASSVOLT is self-boosted with capacitance coupling C1 between the gate and the drain. Furthermore, when the block selection transistors 230 are turned on, the voltage PASSVOLT is further self-boosted with capacitance coupling C2 between the gate and the source. Through the self-boosting of all the block selection transistors 230, all the word lines of the selected block are supplied with the intermediate voltage whose voltage drop is suppressed.

At a time t5, the block selection element 200 drives the local boost signal XB to the H level and drives /XB to the L level. In this way, the transistor Q3 is turned on, the transistor Q4 is turned off, and the voltage PSV of the node N1 is applied to the node bst via the transistor Q3. The node bst is boosted from the GND level up to a PSV-Vth level (Vth is a threshold of the transistor Q3). The voltage of an electrode, i.e., the node bst, of the capacitor Cb is boosted, so as to boost the voltage PASSVOLT of another electrode, i.e., the node N2, of the capacitor Cb by the capacitance coupling of the capacitor Cb. Thus, the gate voltage PASSVOLT of the block selection transistor 230 which is self-boosted is further boosted (e.g., 31 V).

Then, at a time t6, the voltage supplying element supplies a program voltage (e.g., 25 V) to the selected word line. In this circumstance, the gate voltage PASSVOLT of the block selection transistor 230 is highly boosted to a voltage higher than the program voltage. Thus, the program voltage is applied to the selected word line by the block selection transistor 230, without any voltage drop.

Thereafter, at a time t7, the program voltage (supplied to the selected word line) and the intermediate voltage (supplied to non-selected word line) are stopped from being supplied from the voltage supplying element, and the level of the voltage PASSVOLT is gradually decreased. At a time t8, the block selection signal BLKSEL, the local clamp signal XT, the local boost signal XB are driven to the L level.

Hence, according to the present embodiment, as the voltage PASSVOLT applied to the gate of the block selection transistor 230 is boosted in two stages, the target voltage PASSVOLT (i.e., the voltage of the selected word line+Vth of the block selection transistor+a back gate bias<PASSVOLT), without additionally increasing the number of stages of the charge pump circuits. Thus, in comparison with the conventional charge pump circuit, not only the number of stages, but also the layout area and current consumption can be reduced.

In addition, in the present embodiment, the transistor Q1 is interposed between the node N1 and the node N2, such that the source of the transistor Q1 has the voltage PSV, the gate thereof is XT (XT=PSV), the transistor Q1 is in a cut-off state since the source and the gate are at the same level, the voltage is not leaked via the transistor Q1 and clamped even though the voltage PASSVOLT is further boosted.

In the present embodiment, the voltage PSV is charged once to the node bst, so as to boost the voltage PASSVOLT. However, the invention is not limited thereto, and the voltage PASSVOLT may also be boosted through charging for multiple times. In this circumstance, a plurality of pulses are supplied through the local boost signals XB and /XB, so as to turn on and off the transistors Q3 and Q4 for multiple times to repeatedly charge/discharge the node bst (to GND, PSV-Vth, GND, PSV-Vth). Thereby, the voltage PASSVOUT is repeatedly boosted, so as to obtain a greater voltage. Moreover, by boosting in this way for multiple times, the charge operation can be performed again even though the boost voltage is decreased due to the leakage of the capacitor Cb in a long-term operation.

Furthermore, the voltage PASSVOLT may also be monitored to compare the voltage PASSVOLT with the target voltage as required, and based on the comparison result, the local boost signals XB and /XB are applied to the transistors Q3 and Q4 for boosting. Namely, the voltage PASSVOLT may be boosted through the local boost signals XB and /XB if being smaller than the target voltage, and may not be boosted if being greater than the target voltage.

In addition, the capacitor Cb connected to the node N2 is preferably formed by a MOS capacitor. If a parasitic capacitance of the boost circuit 220 is increased due to the capacitor Cb, it may become an obstacle to a high-speed operation. Thus, a diode or a transistor (which is turned on during the boosting), for example, may also be connected between the capacitor Cb and the node N2 to prevent the capacity of the capacitor Cb from being visible from the node N2 side.

Moreover, in the present embodiment, a source of the transistor Q4 is connected to the ground GND, but the leakage of the transistor Q4 is increased if the source is at the GND level. Thus, an inverter may also be connected between the transistor Q4 and the ground GND to supply the local boost signal /XB to an input terminal of the inverter, or connect the source of the transistor Q4 to a voltage, e.g., Vcc or the local boost signal XB. In this circumstance, the latter (which is directly connected to the local boost signal XB) can achieve a better effect. It is the same way for the transistor Q2. The inverter may also be connected between the transistor Q2 and the ground GND to supply the local clamp signal /XT to an input terminal of the inverter, or connect a source of the transistor Q2 to a voltage, e.g., Vcc or the local clamp signal XT.

Afterwards, the description related to the second embodiment of the invention will be set forth below. The block selection element 200 illustrated in FIG. 4 may be arranged for each block of the memory cell array. For instance, referring to FIG. 6, when 1024 blocks (i.e., block_0 to block_1023) are arranged along a column direction, 1024 block selection elements 200_0 to 200_1023 are arranged along the column direction. As this layout is adopted, the block selection elements 200 include level shifters 210 in the same way as that illustrated in FIG. 4, and thus, 1024 level shifters 210 are arranged.

The level shifter 210 outputs the high voltage Vpp output from the charge pump circuit in accordance with the block selection signal BLKSEL at the Vcc voltage level. Thus, in order to mitigate the level difference between the two, depletion-type NMOS transistors capable of bearing high voltages and having low thresholds are used. The depletion-type transistors require long channel lengths, and thus, require a large area. As illustrated in FIG. 6, if 1024 level shifters are arranged, their occupied area is increased, which may become an obstacle to memory chip miniaturization. Thus, in the second embodiment, each block selection element may be shared by a plurality of blocks.

FIG. 7 illustrates an arrangement example of the block selection elements according to the second embodiment of the invention. As illustrated in FIG. 2, when there are 1024 blocks, the blocks are arranged as 8 blocks along a horizontal direction and 128 blocks along a vertical direction, and each level shifter is shared by 8 blocks along the horizontal direction. Namely, the voltage PSV is supplied to the selected 8 blocks along the horizontal direction by any one of the level shifters 210_0 to 210_127. In addition, the selection of any one of the 8 blocks along the horizontal direction is made by decoding 8 local clamp signals XT0 to XT7 (or /XT0 to /XT7) and 8 local boost signals XB0 to XB7 (or /XB0 to /XB7). For instance, if the local clamp signals XT0 and the local boost signal XB0 are selected, then block 0 is selected. If the local clamp signal XT5 and the local boost signal XB5 are selected, then, block 5 among the 8 blocks along the horizontal direction is selected.

Figure 8:
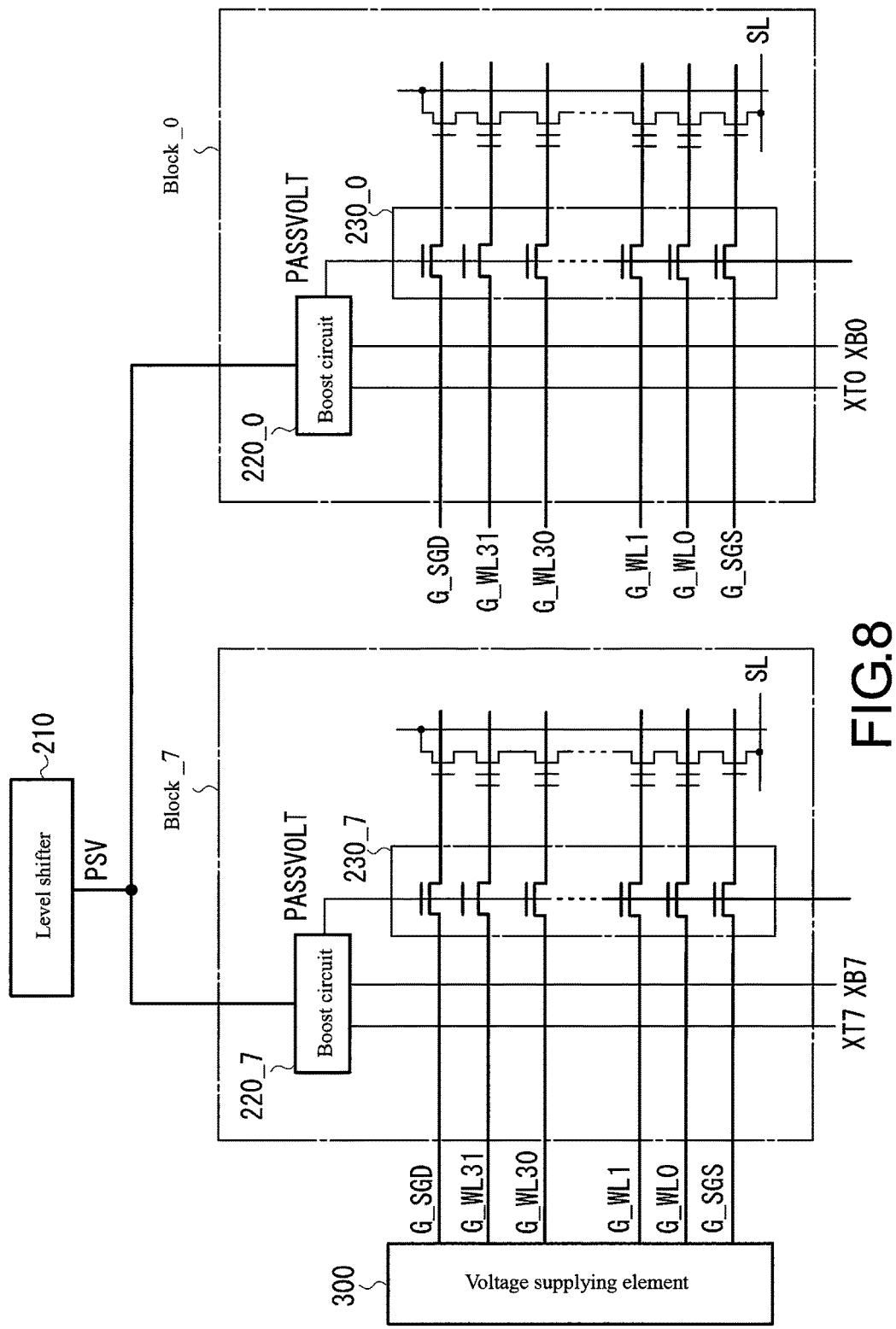
FIG. 8 illustrates a driving method for a word line of the selected block according to the second embodiment of the invention.

FIG. 8 illustrates a detailed condition of selecting block selection elements for 8 blocks arranged along the horizontal direction. When one of the level shifters 210 shared by 8 blocks selects the 8 blocks along the horizontal direction based on the row address information, the voltage PSV is commonly output to boost circuits 220_7 to 220_0 of each block in response to the block selection signal BLKSEL at the H level. The boost circuits 220_7 to 220_0, as described above, are selectively operated according to corresponding local clamp signals XT and local boost signals XB. In addition, output voltages PASSVOLT of the boost circuits 220_7 to 220_0 are respectively output to corresponding block selection transistors 230_7 to 230_0. The voltage supplying element 300 respectively outputs global signal lines G_SGD, G_WL31 to G_WL0 and G_SGS to each of the block selection transistors 230_7 to 230_0. Namely, it should be noted that the voltage supplying element 300 outputs the global signal lines corresponding to the 8 blocks (which are 8×G_SGD, 8×G_WL31 to 8×G_WL0 and 8×G_SGS in this example).

For instance, it is assumed that the level shifter 210_1 is selected, and the block_0 along the horizontal direction is programmed. The local clamp signal XT0 is transited to the H level, the boost circuit 220_0 is turned on, and the level shifter 210, in response to the block selection signal BLKSEL, outputs the voltage PSV to the boost circuits 220_7 to 220_0. As the transistor Q1 of the boost circuit 220_0 is turned on, the voltage PSV is imported into the boost circuit 220_0, and the voltage PASSVOUT is pre-charged to the PSV-Vth level by the voltage PSV. On the other hand, as the transistor Q1 of the boost circuits 220_7 to 220_1 is turned off, the voltage PSV is not imported into the boost circuit.

Then, the voltage supplying element 300 supplies the operating voltages required by the global word lines G_WL. Namely, the voltage supplying element 300 supplies the program voltage to the selected word line, and supplies the intermediate voltage to the non-selected word line. In this circumstance, the voltage PASSVOLT of the node N2 of the boost circuit 220_0 is charged to the PSV-Vth level, the gate of the block selection transistor 230_0 is self-boosted by the supplied program voltage, and the block selection transistor 230_0 is turned on by the boosted gate voltage. On the other hand, as the voltage PASSVOLT of each of the boost circuits 220_7 to 220_1 is 0 V, the block selection transistors 230_7 to 230_1 are turned off.

Thereafter, as the local boost signal XB0 is asserted, the node bst of the boost circuit 220_0 rises from the GND level to the PSV-Vth level, and the node N2 is boosted by the capacitor Cb. Namely, the voltage PASSVOLT, after being boosted in two stages, is boosted to be equal to (the operating voltage+Vth+the back gate bias) or more.

In this way, in the present embodiment, even though the depletion-type level shifters with a large area are used, the level shifters can be shared by the blocks along the horizontal direction to reduce the occupied area of the level shifters as long as few devices (e.g., 4 transistors Q1, Q2, Q3 and Q4 and the capacitor Cb) are arranged for the blocks along the horizontal direction. In the structure illustrated in FIG. 6, 1024 level shifters are required in order to decode 1024 horizontal blocks. In the condition of the sharing for 8 horizontal blocks in the same way as in the present embodiment, total 144 devices (i.e., 128 level shifters (for unit block selection)+16 (XT/XB decoders)=144) are required for decoding the 1024 horizontal blocks. In this way, significant reduction of the occupied area of decoders can be achieved.

In the present embodiment, the increase of the number of the boost circuits sharing the voltage PSV from the level shifters, when the local clamp signal XT is asserted, works to suppress charge sharing between the node N1 and the node N2 within the selected horizontal block. In addition, the source voltage of the transistor Q4 supplied with the local boost signal /XB is substituted as the local boost signal XB from Vss, thereby suppressing the leakage from the node bst. The transistors Q2 and Q4 in the non-selected state can use the voltage Vcc as the gate voltage, such that creation from the XT and XB decoders becomes easier. The voltage PASSVOLT at the highest level is clamped by a junction BV, thereby automatically protecting BVox.

In the embodiment described above, the example where one block selection element is shared by 8 blocks along the horizontal direction is illustrated. However, this is only one example, and one block selection element may also be shared by a plurality of blocks along the horizontal direction.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A non-volatile semiconductor memory device, comprising:
   a memory cell array, comprising a plurality of blocks; and
   a block selection element, selecting one of the blocks of the memory cell array based on row address information, wherein
   the block selection element comprising:
      a plurality of selection transistors, connected to each word line of the block;
      a first circuit, charging a connection node connected to each gate of the selection transistors;
      a second circuit, connected to the first circuit and boosting a voltage of the connection node; and
      a supplying element, supplying an operating voltage to one terminal of the selection transistors, wherein
      the connection node, after performing first boosting by the operating voltage supplied by the supplying element, performs second boosting by the second circuit,
      wherein during first boosting, the connection node is self-boosted by a capacitance coupling between gate and drain of the plurality of selection transistors, when the plurality of selection transistors are turned on, the connection node is further self-boosted by a capacitance coupling between gate and source of the plurality of selection transistors,
      wherein during second boosting, the connection node is further self-boosted by a capacitance connected between the connection node and the second circuit,
      wherein second boosting the connection node is determined by comparing voltage at the connection node is smaller than a target voltage,
      wherein the size of capacitance connected between the connection node and the second circuit is adaptively selected according to a load of the plurality of selection transistors.

2. The non-volatile semiconductor memory device according to claim 1, wherein
   the second circuit includes a capacitor connected to the connection node and supplies a voltage output from the first circuit to the capacitor.

3. The non-volatile semiconductor memory device according to claim 2, wherein the second circuit comprises a first transistor connected between the second circuit and the first circuit, and when the first transistor is set to a turned-on state, the voltage output from the first circuit is supplied to an electrode of the capacitor through the first transistor.

4. The non-volatile semiconductor memory device according to claim 3, wherein
the connection node is repeatedly boosted by switching on/off the first transistor for multiple times to repeatedly charge and discharge the electrode of the capacitor.

5. The non-volatile semiconductor memory device according to claim 1, wherein
the second circuit comprises a second transistor connected between the second circuit and the first circuit, and when the second transistor is set to a turned-on state, the voltage output from the first circuit is charged to the connection node through the second transistor.

6. The non-volatile semiconductor memory device according to claim 1, wherein
the first circuit comprises a level shifter outputting a first voltage based on a high voltage supplied from a charge pump circuit.

7. The non-volatile semiconductor memory device according to claim 1, wherein
the memory cell array comprises the blocks in m rows×n columns, m and n are integers of 2 or more, and the first circuit is shared by the blocks of one row.

8. The non-volatile semiconductor memory device according to claim 1, wherein
each of the blocks comprises the second circuit.

9. The non-volatile semiconductor memory device according to claim 1, wherein
the operating voltage is an intermediate voltage employed for turning on an NAND string when the first boosting is performed.

10. The non-volatile semiconductor memory device according to claim 9, wherein
the supplying element supplies a program voltage to a selected word line after the intermediate voltage is supplied, and the program voltage is supplied to the selected word line through the selection transistor performing the second boosting.

11. A driving method for a word line in a non-volatile semiconductor memory device, comprising:
charging a first voltage to each gate of a plurality of selection transistors configured to select a block of a memory cell array in response to row address information;
supplying an operating voltage required for each word line to one terminal of a plurality of block selection transistors, so as to boost the first voltage of each gate to a second voltage; and
supplying a voltage to a capacitor connected to each gate, so as to boost the second voltage to a third voltage through the capacitor,
wherein during first boosting, the connection node is self-boosted by a capacitance coupling between gate and drain of the plurality of selection transistors, when the plurality of selection transistors are turned on, the connection node is further self-boosted by a capacitance coupling between gate and source of the plurality of selection transistors,
wherein during second boosting, the connection node is further self-boosted by a capacitance connected between the connection node and the second circuit,
wherein second boosting the connection node is determined by comparing voltage at the connection node is smaller than a target voltage,
wherein the size of capacitance connected between the connection node and the second circuit is adaptively selected according to a load of the plurality of selection transistors.

12. The driving method according to claim 11, wherein
the voltage supplied to the capacitor is the first voltage, and the operating voltage is an intermediate voltage employed for turning on an NAND string.

13. The driving method according to claim 11, wherein
the first voltage is employed for charging by a level shifter supplied with a high voltage from a charge pump circuit,
the boosting from the second voltage to the third voltage is performed by a boost circuit using the voltage output from the level shifter.

* * * * *